United States Patent
Lin et al.

(10) Patent No.: US 9,960,947 B2
(45) Date of Patent: May 1, 2018

(54) COMPENSATION CIRCUIT OF POWER AMPLIFIER AND ASSOCIATED COMPENSATION METHOD

(71) Applicant: MEDIATEK INC., Hsin-Chu (TW)

(72) Inventors: Chien-Cheng Lin, Taichung (TW); Ming-Da Tsai, Miaoli County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 15/647,275

(22) Filed: Jul. 12, 2017

(65) Prior Publication Data

US 2018/0069742 A1 Mar. 8, 2018

Related U.S. Application Data

(60) Provisional application No. 62/383,691, filed on Sep. 6, 2016.

(51) Int. Cl.
| | |
|---|---|
| H04B 1/00 | (2006.01) |
| H04L 27/36 | (2006.01) |
| H03D 7/16 | (2006.01) |
| H03F 1/32 | (2006.01) |
| H03C 3/08 | (2006.01) |
| H04B 1/04 | (2006.01) |

(52) U.S. Cl.
CPC ............. *H04L 27/366* (2013.01); *H03C 3/08* (2013.01); *H03D 7/166* (2013.01); *H03F 1/3264* (2013.01); *H04B 2001/0408* (2013.01)

(58) Field of Classification Search
CPC ..... H04W 16/14; H04W 28/04; H04W 24/00; H04B 1/1027; H04B 1/0475; H04B 1/525; H03F 1/3247; H03F 1/32

USPC ....................... 455/63.1, 114.2, 127.1, 195.1
See application file for complete search history.

(56) References Cited

U.S. PATENT DOCUMENTS

| 7,199,652 B2 * | 4/2007 | Morimoto | H03F 3/19 327/560 |
|---|---|---|---|
| 7,428,990 B1 * | 9/2008 | Milford | G06K 7/081 235/435 |
| 7,456,691 B2 * | 11/2008 | Minichshofer | H03F 1/302 330/289 |
| 8,787,850 B2 * | 7/2014 | Bockelman | H03F 1/086 330/292 |
| 2008/0303591 A1 | 12/2008 | Wang | |
| 2011/0074509 A1 | 3/2011 | Samavedam | |
| 2015/0147986 A1 * | 5/2015 | Scott | H03F 1/0272 455/114.3 |

OTHER PUBLICATIONS

Tsai,"A Fully Integrated Multimode Front-End Module for GSM/ EDGE/TD-SCDMA/TD-LTE Applications Using a Class-F CMOS Power Amplifier", 2017 IEEE International Solid-State Circuits Conference.

* cited by examiner

*Primary Examiner* — Nhan Le
(74) *Attorney, Agent, or Firm* — Winston Hsu

(57) ABSTRACT

A compensation circuit of a power amplifier includes a varactor, a voltage sensor and a control circuit. The varactor is coupled to an input terminal of the power amplifier. The voltage sensor is arranged for detecting an amplitude of an input signal of the power amplifier to generate a detecting result. The control circuit is coupled to the varactor and the voltage sensor, and is arranged for controlling a bias voltage of the varactor to adjust a capacitance of the varactor according to the detecting result.

24 Claims, 4 Drawing Sheets

COMPENSATION CIRCUIT OF POWER AMPLIFIER AND ASSOCIATED COMPENSATION METHOD

CROSS REFERENCE TO RELATED APPLICATIONS

This application claims the priority of U.S. Provisional Application No. 62/383,691, filed on Sep. 6, 2016, which is included herein by reference in its entirety.

BACKGROUND

A linearity of a power amplifier is largely affected by an input capacitance of the power amplifier, and a phase of an output signal of the power amplifier may be changed due to the input capacitance when an amplitude of an input signal increases, where this phenomenon is called AM-PM distortion. To make the power amplifier have a stable phase of the output signal, how to design a compensation circuit to improve the linearity of the power amplifier is an importance topic.

SUMMARY

It is therefore an objective of the present invention to provide a compensation circuit of a power amplifier, where the compensation circuit can dynamically adjust the input capacitance of the power amplifier by referring to the amplitude of the input signal. By using the embodiments of the present invention, the AM-PM distortion and the linearity of the power amplifier can be largely improved, and the overall circuit has higher efficiency.

According to one embodiment of the present invention, a compensation circuit of an amplifier includes a varactor, a voltage sensor and a control circuit. The varactor is coupled to an input terminal of the amplifier. The voltage sensor is arranged for detecting an amplitude of an input signal of the amplifier to generate a detecting result. The control circuit is coupled to the varactor and the voltage sensor, and is arranged for controlling a bias voltage of the varactor to adjust a capacitance of the varactor according to the detecting result.

According to another embodiment of the present invention, a method for compensating an amplifier comprises: providing a varactor coupled to an input terminal of the amplifier, wherein a capacitance of the varactor serves as part of input capacitance of the amplifier; detecting an amplitude of an input signal of the amplifier to generate a detecting result; and controlling a bias voltage of the first varactor to adjust the capacitance of the varactor according to the detecting result.

According to another embodiment of the present invention, a circuit comprises a power amplifier and a compensation circuit, where the compensation circuit of a power amplifier comprises a varactor, a voltage sensor and a control circuit. The varactor is coupled to an input terminal of the power amplifier. The voltage sensor is arranged for detecting an amplitude of an input signal of the power amplifier to generate a detecting result. The control circuit is coupled to the varactor and the voltage sensor, and is arranged for controlling a bias voltage of the varactor to adjust a capacitance of the varactor according to the detecting result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
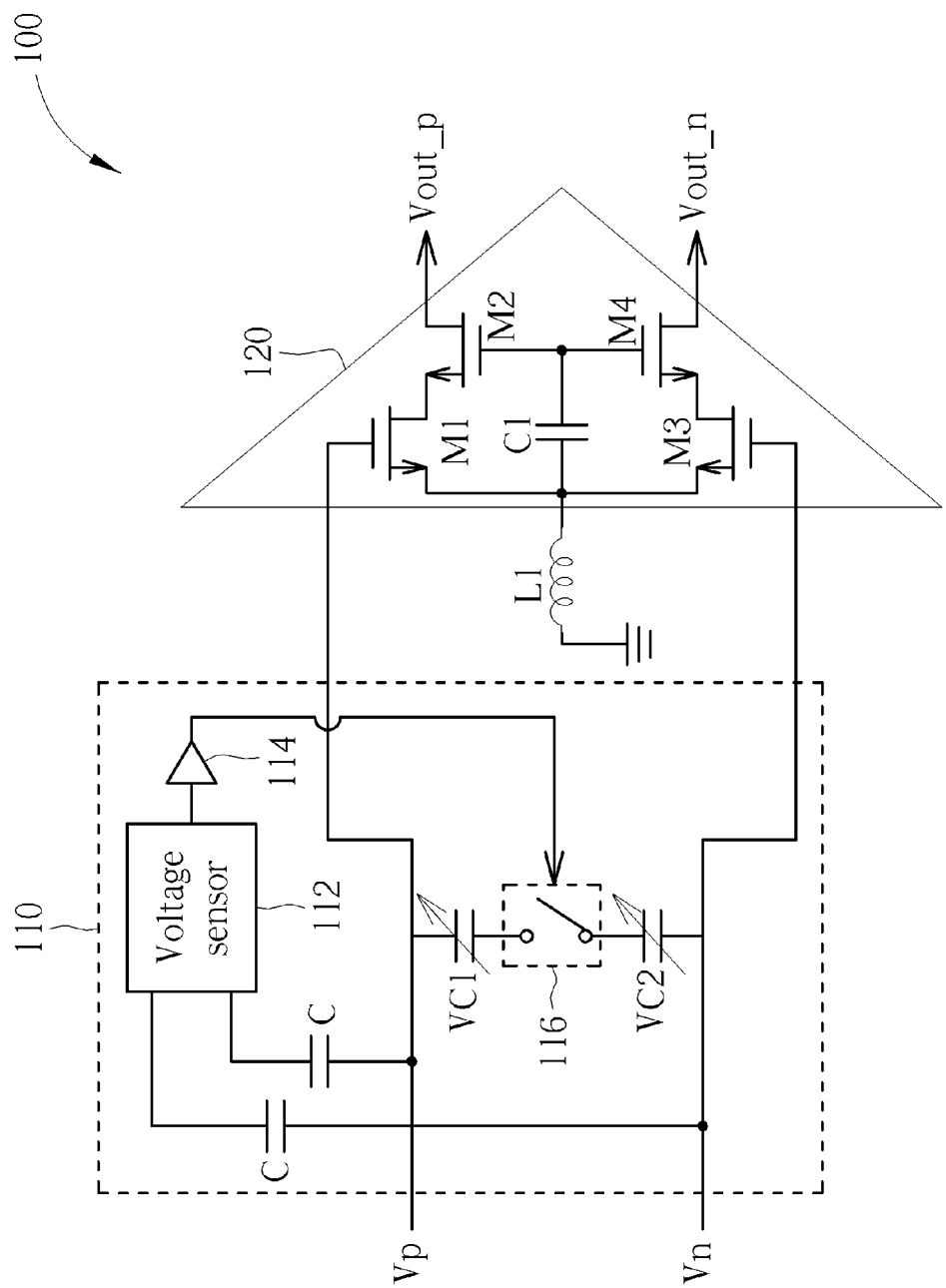
FIG. 1 is a diagram illustrating a power amplifier system according to one embodiment of the present invention.

FIG. 1 is a diagram illustrating a power amplifier system 100 according to one embodiment of the present invention. As shown in FIG. 1, the power amplifier system 100 comprises a compensation circuit 110 and a power amplifier 120, where the compensation circuit 110 comprises a voltage sensor 112, an amplifier 114, a control circuit 116, two varactors VC1 and VC2, and two capacitors C; and the power amplifier 120 comprises transistors M1-M4, a capacitor C1 and an inductor L1. In this embodiment, the power amplifier system 110 is arranged to receive a differential input signal Vp and Vn to generate a differential output signal Vout_p and Vout_n, and the compensation circuit 110 is arranged to compensate an input capacitance of the power amplifier 120.

Regarding the operations of the compensation circuit 110, the voltage sensor 112 receives the differential input signal Vp and Vn via the capacitors C to detect an amplitude of the differential input signal Vp and Vn to generate a detecting result, where the capacitors C are used to block DC voltages. In this embodiment, the detecting result is a voltage signal that represents the amplitude of the differential input signal Vp and Vn, and the detecting result is inputted to the control circuit 116 via the amplifier 114 for adjusting a voltage level of the detecting result. Then, the control circuit 116 controls/adjusts the capacitance of the varactors VC1 and VC2 to compensate the input capacitance of the power amplifier 120 according to the detecting result. In one embodiment, the input terminals of the power amplifier have fixed DC voltages (i.e. the upper node of the varactor VC1 or the lower node of the varactor VC2 has a fixed DC voltage), and the control circuit 116 can adjust the capacitance of the varactors VC1 and VC2 by setting the appropriate bias voltages to the lower node of the varactor VC1 and the upper node of the varactor VC2.

Figure 2:
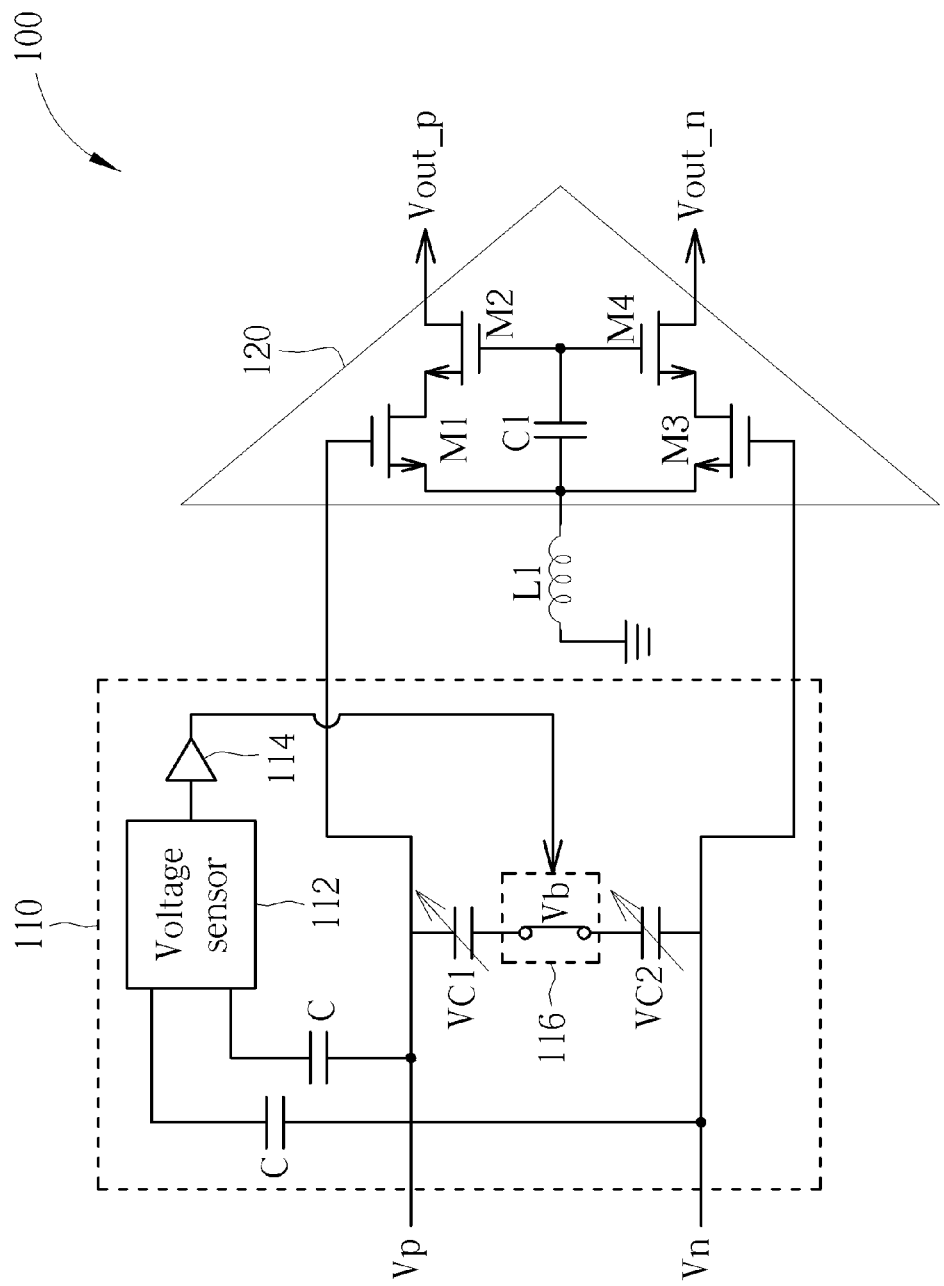
FIG. 2 is a diagram illustrating the operations of the control circuit and the varactors according to one embodiment of the present invention.

In this embodiment, the control circuit 116 is represented by a switch, and the switch is turned on or off according to the detecting result. For example, when the detecting result indicates that the differential input signal Vp and Vn has large power/amplitude, the switch is turned on to connect the varactor VC1 to the varactor VC2 as shown in FIG. 2, and the control circuit 116 can set the bias voltage Vb to the connection node of the varactors VC1 and VC2 to control/adjust the capacitance of the varactors VC1 and VC2. When the detecting result indicates that the differential input signal Vp and Vn has lower power/amplitude and it is not required to compensate the input capacitance of the power amplifier 120, the switch is turned off, and the lower node of the varactor VC1 and the upper node of the varactor VC2 are at floating state. In addition, in one embodiment, when the detecting result indicates that the amplitude of the differential input signal Vp and Vn increase, the control circuit 116 controls the bias voltage of the varactors VC1 and VC2 to increase the capacitance of the varactors VC1 and VC2; and when the detecting result indicates that the amplitude of the differential input signal Vp and Vn decrease, the control circuit 116 controls the bias voltage of the varactors VC1 and VC2 to decrease the capacitance of the varactors VC1 and VC2.

By using the aforementioned compensation method, the input capacitance of the power amplifier 120 can be dynamically compensated according to the amplitude of the input differential signal Vp and Vn, therefore, the phase of the differential output signal Vout_p and Vout_n will be more stable even if the amplitude of the input differential signal Vp and Vn has frequent changes, and the AM-PM distortion can be effectively improved.

Figure 3:
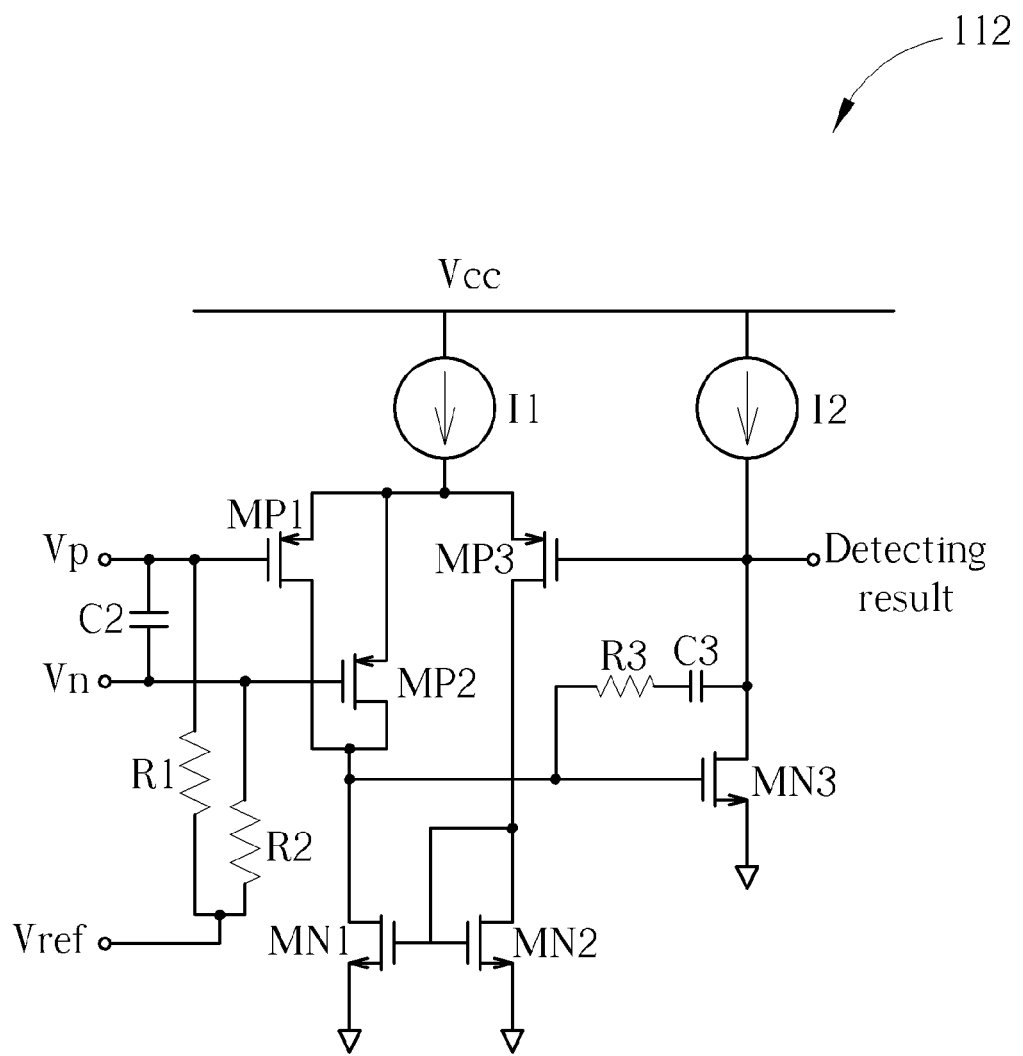
FIG. 3 is a diagram illustrating the voltage sensor according to one embodiment of the present invention.

FIG. 3 is a diagram illustrating the voltage sensor 112 according to one embodiment of the present invention. As shown in FIG. 3, the voltage sensor 112 comprises three P-type metal-oxide semiconductors (PMOS) MP1-MP3, three NMOSs MN1-MN3, two current source I1-I2, three resistors R1-R3 and two capacitors C2-C3. The embodiment shown in FIG. 3 is a peak detector that compares the differential input signal Vp and Vn with a reference voltage to detect a swing amplitude or a peak value of the differential input signal Vp and Vn, and a voltage level of the detecting result is used to represent the swing amplitude or the peak value of the differential input signal Vp and Vn.

Figure 4:
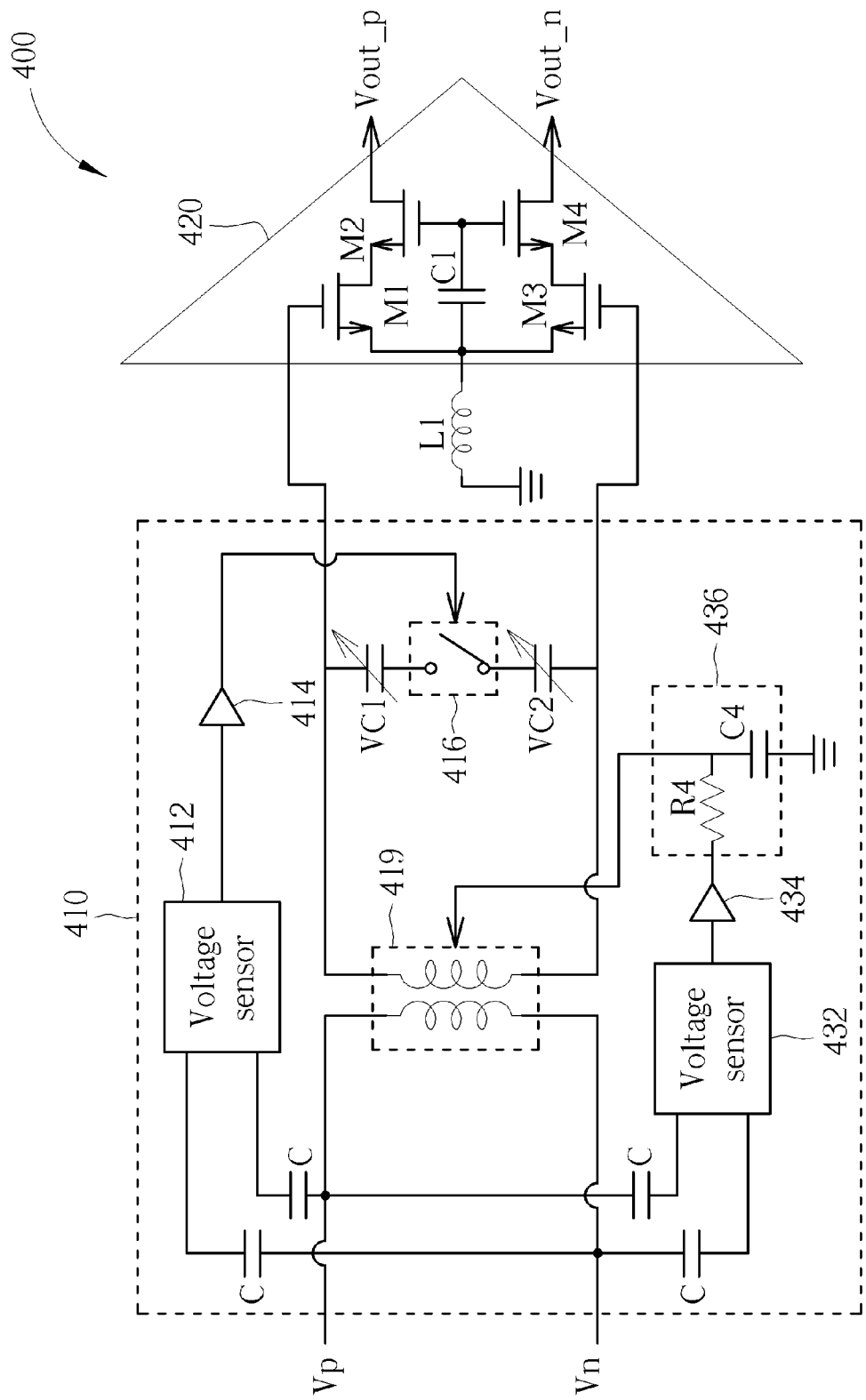
FIG. 4 is a diagram illustrating a power amplifier system according to another embodiment of the present invention.

FIG. 4 is a diagram illustrating a power amplifier system 400 according to another embodiment of the present invention. As shown in FIG. 4, the power amplifier system 100 comprises a compensation circuit 410 and a power amplifier 420, where the compensation circuit 410 comprises two voltage sensors 412 and 432, two amplifiers 414 and 434, two control circuits 416 and 436, two varactors VC1 and VC2, a transformer 419, and four capacitors C; and the power amplifier 120 comprises transistors M1-M4, a capacitor C1 and an inductor L1. In this embodiment, the power amplifier system 410 is arranged to receive a differential input signal Vp and Vn via a transformer 419 to generate a differential output signal Vout_p and Vout_n, and the compensation circuit 410 is arranged to compensate an input capacitance of the power amplifier 420.

Regarding the compensation circuit 410, the voltage sensor 412, the amplifier 414, the control circuit 416 and the varactors VC1 and VC2 can be viewed as a phase-modulation (PM) compensation loop to make the phase of the differential input signal Vp and Vn more stable, and the voltage sensor 432, the amplifier 434, the control circuit 436 and the transformer 419 can be viewed as a amplitude-modulation (AM) compensation loop to make the power amplifier 420 work with higher linearity and efficiency. Firstly, regarding the operations of the PM compensation loop, the voltage sensor 412 receives the differential input signal Vp and Vn via the capacitors C to detect an amplitude of the differential input signal Vp and Vn to generate a detecting result, where the capacitors C are used to block DC voltages. In this embodiment, the detecting result is a voltage signal that represents the amplitude of the differential input signal Vp and Vn, and the detecting result is inputted to the control circuit 416 via the amplifier 414 for adjusting a voltage level of the detecting result. Then, the control circuit 416 controls/adjusts the capacitance of the varactors VC1 and VC2 to compensate the input capacitance of the power amplifier 420 according to the detecting result.

In this embodiment, the control circuit 416 is represented by a switch, and the switch is turned on or off according to the detecting result. For example, when the detecting result indicates that the differential input signal Vp and Vn has large power/amplitude, the switch is turned on to connect the varactor VC1 to the varactor VC2 (e.g. the embodiment shown in FIG. 2), and the control circuit 416 can set an appropriate bias voltage to the connection node of the varactors VC1 and VC2 to control/adjust the capacitance of the varactors VC1 and VC2. When the detecting result indicates that the differential input signal Vp and Vn has lower power/amplitude and it is not required to compensate the input capacitance of the power amplifier 420, the switch is turned off, and the lower node of the varactor VC1 and the upper node of the varactor VC2 are at floating state. In addition, in one embodiment, when the detecting result indicates that the amplitude of the differential input signal Vp and Vn increase, the control circuit 416 controls the bias voltage of the varactors VC1 and VC2 to increase the capacitance of the varactors VC1 and VC2; and when the detecting result indicates that the amplitude of the differential input signal Vp and Vn decrease, the control circuit 416 controls the bias voltage of the varactors VC1 and VC2 to decrease the capacitance of the varactors VC1 and VC2.

By using the aforementioned PM compensation method, the input capacitance of the power amplifier 420 can be dynamically compensated according to the amplitude of the input differential signal Vp and Vn, therefore, the phase of the differential output signal Vout_p and Vout_n will be more stable even if the amplitude of the input differential signal Vp and Vn has frequent changes, and the AM-PM distortion can be effectively improved.

Regarding the operations of the AM compensation loop, the voltage sensor 432 receives the differential input signal Vp and Vn via the capacitors C to detect an amplitude of the differential input signal Vp and Vn to generate a detecting result, where the capacitors C are used to block DC voltages. In this embodiment, the detecting result is a voltage signal that represents the amplitude of the differential input signal Vp and Vn, and the detecting result is inputted to the control circuit 436 via the amplifier 434 for adjusting a voltage level of the detecting result. Then, a resistor R4 and a capacitor C4 within the control circuit 436 serve as a voltage divider to provide a bias voltage to a center tap of the transformer 419 according to the detecting result.

In this embodiment, when the amplitude of the differential input signal Vp and Vn increase, the control circuit 436 applies the higher bias voltage to the center tap of the transformer 419 to make the input terminals of the power amplifier 420 have higher DC voltages, therefore, the linearity of the power amplifier 420 will not be worsened even when the differential input signal Vp and Vn have large swing amplitude. In addition, when the amplitude of the differential input signal Vp and Vn decrease, the control circuit 436 applies the lower bias voltage to the center tap of the transformer 419 to make the input terminals of the power amplifier 420 have lower DC voltages, therefore, the power consumption of the power amplifier 420 can be improved.

By using the aforementioned AM compensation method, the DC voltages of the input terminals of the power amplifier 420 can be dynamically adjusted according to the amplitude of the input differential signal Vp and Vn, therefore, the power amplifier 420 can have better linearity and suitable power consumption.

The voltage sensors 412 and 432 can be implemented by the embodiment shown in FIG. 3, without a limitation of the present invention.

Briefly summarized, in the compensation circuit of the present invention, the compensation circuit can dynamically adjust the input capacitance of the power amplifier by referring to the amplitude of the input signal, and the AM-PM distortion and the linearity of the power amplifier can be largely improved. In addition, the compensation circuit further dynamically adjusts the DC voltages of the input terminals of the power amplifier by referring to the amplitude of the input signal to make the power amplifier have better linearity and suitable power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A compensation circuit of an amplifier, comprising:
a first varactor, coupled to a first input terminal of the amplifier;
a second varactor, coupled to a second input terminal of the amplifier;
a voltage sensor, for detecting an amplitude of an input signal of the amplifier to generate a detecting result; and
a control circuit, coupled to the first varactor, the second varactor and the voltage sensor, for controlling a bias voltage of the first varactor to adjust a capacitance of the first varactor according to the detecting result, and controlling a bias voltage of the second varactor to adjust a capacitance of the second varactor according to the detecting result.

2. The compensation circuit of claim 1, wherein one terminal of the first varactor is connected to the first input terminal of the amplifier, and another terminal of the first varactor is used to receive the bias voltage provided by the control circuit.

3. The compensation circuit of claim 1, wherein when the amplitude of the input signal increases, the control circuit controls the bias voltage of the first varactor to increase the capacitance of the first varactor.

4. The compensation circuit of claim 1, wherein when the amplitude of the input signal decreases, the control circuit controls the bias voltage of the first varactor to decrease the capacitance of the first varactor.

5. The compensation circuit of claim 1, wherein one terminal of the first varactor is connected to the first input terminal of the amplifier, one terminal of the second varactor is connected to the second input terminal of the amplifier, and another terminal of the first varactor and another terminal of the second varactor are used to receive the bias voltage provided by the control circuit.

6. The compensation circuit of claim 5, wherein the control circuit comprises:
a switch, for connecting or disconnecting the other terminal of the first varactor to the other terminal of the second varactor.

7. The compensation circuit of claim 6, wherein the control circuit determines to turn on or off the switch according to the detecting result, and when the switch is on, the control circuit applies the bias voltage to the other terminal of the first varactor and the other terminal of the second varactor; and when the switch is off, the control circuit does not provide any bias voltage to the other terminals of the first varactor and the second varactor.

8. The compensation circuit of claim 1, wherein a transformer is arranged to provide the input signal to the input terminal of the amplifier, and the compensation circuit further comprises:
another voltage sensor, for detecting the amplitude of an input signal of the amplifier to generate another detecting result; and
another control circuit, coupled to the other voltage sensor, for controlling a voltage level of a center tap of the transformer according to the other detecting result.

9. A circuit, comprising:
a power amplifier; and
a compensation circuit comprising:
a first varactor, coupled to a first input terminal of the power amplifier;
a second varactor, coupled to a second input terminal of the power amplifier;
a voltage sensor, for detecting an amplitude of an input signal of the power amplifier to generate a detecting result; and
a control circuit, coupled to the first varactor, the second varactor and the voltage sensor, for controlling a bias voltage of the first varactor to adjust a capacitance of the first varactor according to the detecting result, and controlling a bias voltage of the second varactor to adjust a capacitance of the second varactor according to the detecting result.

10. The circuit of claim 9, wherein one terminal of the first varactor is connected to the first input terminal of the power amplifier, and another terminal of the first varactor is used to receive the bias voltage provided by the control circuit.

11. The circuit of claim 9, wherein when the amplitude of the input signal increases, the control circuit controls the bias voltage of the first varactor to increase the capacitance of the first varactor.

12. The circuit of claim 9, wherein when the amplitude of the input signal decreases, the control circuit controls the bias voltage of the first varactor to decrease the capacitance of the first varactor.

13. The circuit of claim 9, wherein one terminal of the first varactor is connected to the first input terminal of the power amplifier, one terminal of the second varactor is connected to the second input terminal of the power amplifier, and another terminal of the first varactor and another terminal of the second varactor are used to receive the bias voltage provided by the control circuit.

14. The circuit of claim 13, wherein the control circuit comprises:
a switch, for connecting or disconnecting the other terminal of the first varactor to the other terminal of the second varactor.

15. The circuit of claim 14, wherein the control circuit determines to turn on or off the switch according to the detecting result, and when the switch is on, the control circuit applies the bias voltage to the other terminal of the first varactor and the other terminal of the second varactor; and when the switch is off, the control circuit does not provide any bias voltage to the other terminals of the first varactor and the second varactor.

16. The circuit of claim 9, wherein a transformer is arranged to provide the input signal to the input terminal of the power amplifier, and the compensation circuit further comprises:
- another voltage sensor, for detecting the amplitude of an input signal of the power amplifier to generate another detecting result; and
- another control circuit, coupled to the other voltage sensor, for controlling a voltage level of a center tap of the transformer according to the other detecting result.

17. A compensation circuit of an amplifier, comprising:
a first varactor, coupled to a first input terminal of the amplifier;
a voltage sensor, for detecting an amplitude of an input signal of the amplifier to generate a detecting result; and
a control circuit, coupled to the first varactor and the voltage sensor, for controlling a bias voltage of the first varactor to adjust a capacitance of the first varactor according to the detecting result;
wherein a transformer is arranged to provide the input signal to the input terminal of the amplifier, and the compensation circuit further comprises:
  another voltage sensor, for detecting the amplitude of an input signal of the amplifier to generate another detecting result; and
  another control circuit, coupled to the other voltage sensor, for controlling a voltage level of a center tap of the transformer according to the other detecting result.

18. The compensation circuit of claim 17, wherein one terminal of the first varactor is connected to the first input terminal of the amplifier, and another terminal of the first varactor is used to receive the bias voltage provided by the control circuit.

19. The compensation circuit of claim 17, wherein when the amplitude of the input signal increases, the control circuit controls the bias voltage of the first varactor to increase the capacitance of the first varactor.

20. The compensation circuit of claim 17, further comprising:
a second varactor, coupled to a second input terminal of the amplifier;
wherein the control circuit further controls a bias voltage of the second varactor to adjust a capacitance of the second varactor according to the detecting result.

21. A circuit, comprising:
a power amplifier; and
a compensation circuit comprising:
  a first varactor, coupled to a first input terminal of the power amplifier;
  a voltage sensor, for detecting an amplitude of an input signal of the power amplifier to generate a detecting result; and
  a control circuit, coupled to the first varactor and the voltage sensor, for controlling a bias voltage of the first varactor to adjust a capacitance of the first varactor according to the detecting result;
wherein a transformer is arranged to provide the input signal to the input terminal of the power amplifier, and the compensation circuit further comprises:
  another voltage sensor, for detecting the amplitude of an input signal of the power amplifier to generate another detecting result; and
  another control circuit, coupled to the other voltage sensor, for controlling a voltage level of a center tap of the transformer according to the other detecting result.

22. The circuit of claim 21, wherein one terminal of the first varactor is connected to the first input terminal of the power amplifier, and another terminal of the first varactor is used to receive the bias voltage provided by the control circuit.

23. The circuit of claim 21, wherein when the amplitude of the input signal increases, the control circuit controls the bias voltage of the first varactor to increase the capacitance of the first varactor.

24. The circuit of claim 21, further comprising:
a second varactor, coupled to a second input terminal of the power amplifier;
wherein the control circuit further controls a bias voltage of the second varactor to adjust a capacitance of the second varactor according to the detecting result.

* * * * *